United States Patent
Biernot et al.

(10) Patent No.: US 11,725,302 B2
(45) Date of Patent: Aug. 15, 2023

(54) INSERT FOR HOT ISOSTATIC PRESSING TREATMENT

(71) Applicants: ROLLS-ROYCE plc, London (GB); ROLLS-ROYCE DEUTSCHLAND LTD & CO KG, Blankenfelde-Mahlow (DE)

(72) Inventors: Felix Biernot, Frankfurt (DE); Toma D Nikolov, Berlin (DE); Priyesh R Patel, Solihull (GB); Justin P M Tsang, Derby (JP)

(73) Assignees: ROLLS-ROYCE plc, London (GB); ROLLS-ROYCE DEUTSCHLAND LTD & CO KG, Dahlewitz (DE)

( * ) Notice: Subject to any disclaimer, the term of this patent is extended or adjusted under 35 U.S.C. 154(b) by 550 days.

(21) Appl. No.: 16/740,818

(22) Filed: Jan. 13, 2020

(65) Prior Publication Data
US 2020/0248334 A1     Aug. 6, 2020

(30) Foreign Application Priority Data
Feb. 6, 2019 (GB) .................................. 1901611

(51) Int. Cl.
*C30B 33/02* (2006.01)
*C22F 1/00* (2006.01)
*F01D 5/14* (2006.01)

(52) U.S. Cl.
CPC ............. *C30B 33/02* (2013.01); *C22F 1/008* (2013.01); *F01D 5/14* (2013.01); *F05D 2220/30* (2013.01);
(Continued)

(58) Field of Classification Search
CPC ....... C30B 33/02; C30B 35/002; C22F 1/008; F01D 5/14; F01D 5/286; F05D 2220/30;
(Continued)

(56) References Cited

U.S. PATENT DOCUMENTS

| 5,941,700 A | 8/1999 | Fuchs | |
| 2004/0221771 A1* | 11/2004 | Moore, Jr. | ......... B65D 19/0012 108/57.25 |
| 2017/0030211 A1* | 2/2017 | Marin | ..................... F01D 5/288 |

FOREIGN PATENT DOCUMENTS

| CN | 203163506 U | 8/2013 |
| CN | 205046159 U | 2/2016 |

(Continued)

OTHER PUBLICATIONS

May 30, 2019 Search Report issued in British Application No. 1901611.2.

*Primary Examiner* — Anthony M Liang
*Assistant Examiner* — Danny N Kang
(74) *Attorney, Agent, or Firm* — Oliff PLC

(57) ABSTRACT

An insert fixture for use in the manufacture of a single crystal component by a hot isostatic pressing process. The insert fixture comprising: at least a lower plate separated from an upper plate by interconnecting members. The upper plate comprises at least a slot for the insertion of the single crystal component. The lower plate features a related engagement feature for engaging with the single crystal component. The insert fixture may be cast from a ceramic material. The insert fixture may be cast from an alumina ceramic or molybdenum alloy. The interconnecting members may be made from a molybdenum alloy.

15 Claims, 2 Drawing Sheets

(52) U.S. Cl.
CPC .... *F05D 2230/42* (2013.01); *F05D 2300/701* (2013.01)

(58) Field of Classification Search
CPC ........... F05D 2230/42; F05D 2300/701; F05D 2300/607
See application file for complete search history.

(56) References Cited

FOREIGN PATENT DOCUMENTS

| | | |
|---|---|---|
| CN | 107931613 A | 4/2018 |
| KR | 101781065 B1 | 10/2017 |

\* cited by examiner

INSERT FOR HOT ISOSTATIC PRESSING TREATMENT

CROSS-REFERENCE TO RELATED APPLICATIONS

This specification is based upon and claims the benefit of priority from United Kingdom patent application number GB 1901611.2 filed on Feb. 6, 2019, the entire contents of which are incorporated herein by reference.

BACKGROUND

Field of the Disclosure

The present disclosure concerns an insert for supporting components during hot isostatic pressing (HIP).

Description of the Related Art

Turbine blades and vanes used in gas turbine engines can be manufactured as single crystal structures. The materials for these are typically nickel or cobalt based superalloys, which can be cast to form the desired shape with a single crystal structure. The use of such materials allows the blades to withstand the forces and temperatures in the engine for prolonged periods of time. An issue, however, arises with the casting process in that micro-voids can be formed in the crystal blades. When the blades are in operation repeated exposure to the thermal and operational conditions of the engine can result in creep, which is a deformation of an area of the blade resulting from the strain and temperature which the components are under. Any creep around the micro-void regions can be greater than in the surrounding areas, and as such can lead to cracks within the component.

After casting the single crystal blades are subjected to a HIP treatment to improve the creep resistance; this technique is used as it removes the micro-voids within the structure. To carry out the HIP treatment, the blades are placed in a basket before being sealed into a containment vessel. Once in the containment vessel the blades are subjected to both high temperatures and high isostatic gas pressure. This treatment process is performed with the blades being randomly distributed in the basket before the vessel is sealed. This random distribution of blades, however, can lead to some of the blades being positioned poorly and even touching neighbouring blades or the basket. This contact between the components is one of the issues of the current HIP treatment, as any point of contact on the blades leads to localised damage resulting from re-crystallisation in the area where contact was present. This damaged region means that some of the blades have to be reworked or scrapped. As a result, there is a need to overcome these losses and/or to produce a more efficient means of treating the blades and at least to provide a useful alternative insert.

SUMMARY OF THE DISCLOSURE

According to a first aspect there is provided an insert fixture used in the manufacture of a single crystal component by a hot isostatic pressing process, the insert fixture comprising: at least a lower plate separated from an upper plate by interconnecting members, wherein the upper plate comprises at least a slot for the insertion of the single crystal component and the lower plate featuring a related engagement feature for engaging with the single crystal component.

It has been found that placing the blades within the insert fixture can remove any contact between the single crystal components. This reduces the amount of damage to the blades due to recrystallisation of the contact regions. This reduces the need for blade scrappage and reworking that is required. It also means that all the components are subjected to equal processing conditions, so the reproducibility between batches is maintained, thus providing a more reliable treatment method.

The upper and lower plates in the insert fixture may be composed of a ceramic material.

The upper and lower plates in the insert fixture may composed from alumina ceramic.

The interconnecting members may be made from molybdenum.

The insert fixture may also be constructed from a molybdenum lanthanum oxide and/or titanium zirconium molybdenum. The insert fixture may then be coated with aluminium oxide.

A spacer may be added to the base of the lower plate.

The upper plate may comprise a plurality of slots and the lower plate comprises a plurality of corresponding engagement features.

The engagement features may comprise a slot in the lower plate.

The engagement means may comprise a clip mounted to the lower plate.

The slot in the upper plate may feature an insert liner.

The insert liner may be made from a ceramic material.

The insert liner may be made from alumina or a molybdenum alloy.

The insert liner may be coated in aluminium oxide.

According to a second aspect there is provided a method of hot isostatic pressing (HIP) processing a single crystal component, the method comprising the steps of: inserting the turbine blade into the insert fixture of the first aspect; placing the insert fixture with the turbine blade into an HIP processing vessel; and treating the turbine blade within the HIP processing vessel in an HIP atmosphere.

The HIP atmosphere may comprise a temperature of up to 1500° C. and a pressure of up to 150 MPa.

The single crystal component may be a turbine blade.

The skilled person will appreciate that except where mutually exclusive, a feature described in relation to any one of the above aspects may be applied mutatis mutandis to any other aspect. Furthermore, except where mutually exclusive any feature described herein may be applied to any aspect and/or combined with any other feature described herein.

BRIEF DESCRIPTION OF THE DRAWINGS

Embodiments will now be described by way of example only, with reference to the Figures, in which.

DETAILED DESCRIPTION OF THE DISCLOSURE

Figure 1:
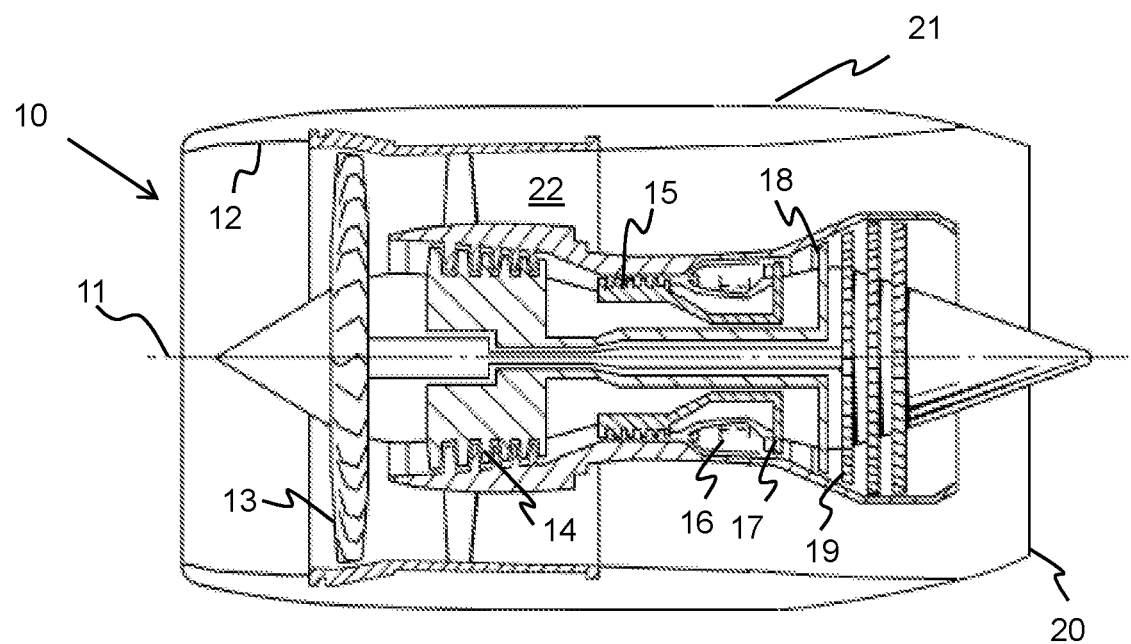
FIG. 1 is a sectional side view of a gas turbine engine.

With reference to FIG. 1, a gas turbine engine is generally indicated at 10, having a principal and rotational axis 11. The engine 10 comprises, in axial flow series, an air intake 12, a propulsive fan 13, an intermediate pressure compressor 14, a high-pressure compressor 15, combustion equipment 16, a high-pressure turbine 17, an intermediate pressure turbine 18, a low-pressure turbine 19 and an exhaust nozzle 20. A nacelle 21 generally surrounds the engine 10 and defines both the intake 12 and the exhaust nozzle 20. The gas turbine engine 10 works in the conventional manner so that air entering the intake 12 is accelerated by the fan 13 to produce two air flows: a first air flow into the intermediate pressure compressor 14 and a second air flow which passes through a bypass duct 22 to provide propulsive thrust. The intermediate pressure compressor 14 compresses the air flow directed into it before delivering that air to the high pressure compressor 15 where further compression takes place.

The compressed air exhausted from the high-pressure compressor 15 is directed into the combustion equipment 16 where it is mixed with fuel and the mixture combusted. The resultant hot combustion products then expand through, and thereby drive the high, intermediate and low-pressure turbines 17, 18, 19 before being exhausted through the nozzle 20 to provide additional propulsive thrust. The high 17, intermediate 18 and low 19 pressure turbines drive respectively the high pressure compressor 15, intermediate pressure compressor 14 and fan 13, each by suitable interconnecting shaft.

Other gas turbine engines to which the present disclosure may be applied may have alternative configurations. By way of example such engines may have an alternative number of interconnecting shafts (e.g. two) and/or an alternative number of compressors and/or turbines. Further the engine may comprise a gearbox provided in the drive train from a turbine to a compressor and/or fan.

In the HIP process, a number of baskets are typically used to support the components within the pressure vessel. Each basket can be of a rivet design, featuring a cylindrical outer wall and inner internal support structure. Coupled to these is a base plate that is provided with a series of holes to avow the gas to flow between the different baskets. The baskets are then stacked in any suitable configuration before being inserted into the HIP processing vessel. This could be for example 1, 2, 3, 4, 5, 6, 7 or greater number of baskets stacked on top of each other. Each basket is also provided with a number of thermocouples to monitor the temperature conditions inside each basket.

Figure 2:
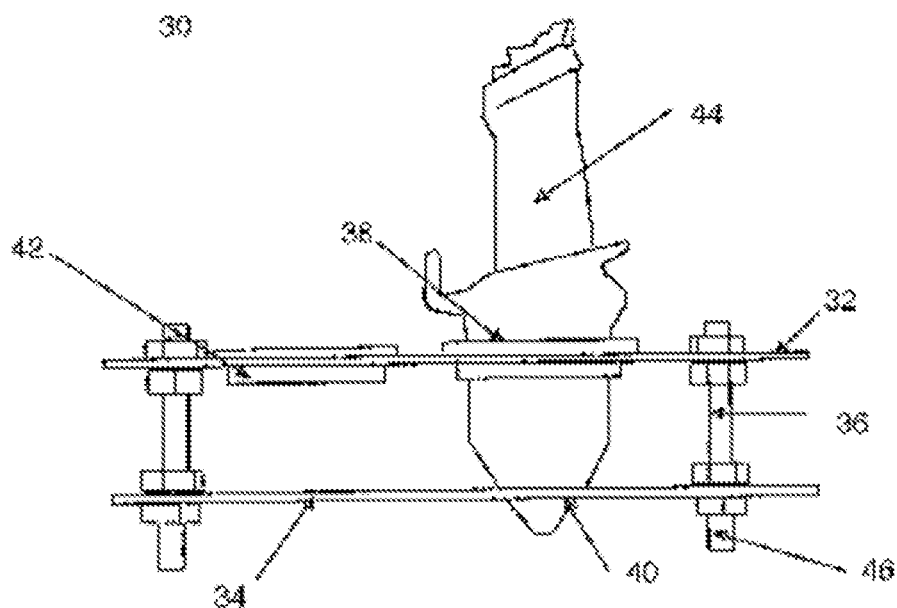
FIG. 2 is a sectional view of a portion of the insert fixture for HIP treatment of the present disclosure.

The insert fixture 30 for placing in a HIP processing basket is shown in FIG. 2. This insert basket comprises two or more plates, which form at least an upper 32 and a lower 34 plate. These plates are separated from each other by a plurality of interconnecting members 36. The reference to upper and lower is relative to the operation of the device, in which the lower plate is placed closer to the base of the HIP basket than the upper plate. The upper plate features at least a slot 38 through it. However, the upper plate may also feature a plurality of slots. The lower plate features at least an engagement feature 40. The lower plate may feature a plurality of engagement means. The engagement means on the lower plate are configured to be positioned relative to the slots in the upper plate. The alignment configuration means that objects that are undergoing HIP processing can be inserted through the slot at the top of the upper plate and into the engagement means of the lower plate. This allows the object to be maintained in a fixed position during processing. The engagement means on the lower plate may be an engagement clip. The engagement means on the lower plate could also be a slot; this is the configuration as shown in FIG. 2. The person skilled in the art will appreciate that any suitable engagement means could be employed on the lower plate, and that the choice may depend on the geometry of the component that is being processed. The lower plate may be provided with a spacer 46 on its base, such that it does not directly contact the base of the HIP processing basket. The spacers may be part of the interconnecting members and extend through the lower plate. In the example shown in FIG. 2 the, turbine blades 44 have been inserted into the insert at a fixed orientation. The blades are inserted by sliding the root of the blade through the slot and then into the lower plates engagement means-slot. The slots are positioned and oriented such that none of the blades contact any part of another blade. The use of the insert, therefore, overcomes the limitations of the blades touching in the basket.

The insert fixture may be formed from sheet material or cast to form the desired shape. The fixture may be made from any suitable material such as ceramics or alloy metals. Alumina ceramic could for example be used as this material has good wear resistance allowing it to be used multiple times. Other suitable ceramics would be alumina. Suitable metals and alloys may include molybdenum lanthanum oxide and titanium zirconium molybdenum (TZM). The interconnecting members can be made from any suitable material. For Example, this could be the use of molybdenum. These materials are desirable due to their high melting points and relatively high strengths. If a clip is used rather than a slot this could be made from molybdenum lanthanum oxide or titanium zirconium molybdenum. Lining the slot in the upper plate and or lower plate may be an alumina insert 42. This prevents the blade object being processed from directly contacting the plate, as this may have effects on the effect of the treatment. The plates may be further coated. This could be though the use of a suitable oxide. Such an oxide may be aluminium oxide $Al_2O_3$.

In processing, the insert is positioned into the HIP basket before the blades are loaded into each cell. As the insert may only have a single orientation for insertion into the basket, it means that the processing conditions on each blade can be reproduced between batches. Once the insert has been filled with the blades the basket can then be loaded onto the others in the vessel and sealed. The HIP processing is then carried out in an argon atmosphere, and the relative openness of the cells allows the gas to pass to all the blades in an unrestricted way. This process removes the microvoids formed during the production of the single crystal blades and thus reduces the requirements to scrap or rework these damaged blades. The pressures and temperatures within the HIP vessel may be up to 1500° C. and up to 150 MPa.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

We claim:

1. An assembly comprising:
    an insert fixture configured for manufacture of a single crystal component by a hot isostatic pressing process, the insert fixture comprising: a lower plate separated from an upper plate by interconnecting members, wherein the upper plate comprises a slot for insertion of the single crystal component and the lower plate comprises a related engagement feature for engaging with the single crystal component; and
    a cast turbine engine component comprising nickel or cobalt based superalloy, wherein the cast turbine engine component is retained by the slot and the engagement feature.

2. The assembly as claimed in claim 1, wherein the upper and lower plates in the insert fixture are composed of a ceramic material.

3. The assembly as claimed in claim 1, wherein the upper and lower plates in the insert fixture are composed of an alumina ceramic.

4. The assembly according to claim 1, wherein the interconnecting members are made from a molybdenum alloy.

5. The assembly as claimed in claim 1, wherein a spacer is added to the base of the lower plate.

6. The assembly as claimed in claim 1, wherein the upper plate comprises a plurality of slots and the lower plate comprises a plurality of corresponding engagement feature.

7. The assembly as claimed in claim 1, wherein the engagement feature comprises a slot in the lower plate.

8. The assembly as claimed in claim 1, wherein the engagement feature comprises a clip mounted to the lower plate.

9. The assembly as claimed in claim 1, wherein the slot in the upper plate comprises an insert liner.

10. The assembly as claimed in claim 9, wherein the insert liner is made from alumina or a molybdenum alloy.

11. The assembly as claimed in claim 10, wherein the insert liner is coated in aluminium oxide.

12. A method of hot isostatic pressing (HIP) processing a single crystal component, the method comprising the steps of:
    placing the assembly of claim 1 into an HIP processing vessel; and
    treating the cast turbine engine component within the HIP processing vessel in an HIP atmosphere.

13. The method as claimed in claim 12 wherein the HIP atmosphere comprises a temperature of up to 1500° C. and a pressures of up to 150 MPa.

14. The method as claimed in claim 12, wherein the cast turbine engine component is a turbine blade.

15. The assembly as claimed in claim 1, wherein the upper and lower plates in the insert fixture are composed of molybdenum alloy.

* * * * *